United States Patent
Adams et al.

(10) Patent No.: US 7,026,899 B2
(45) Date of Patent: Apr. 11, 2006

(54) PUSH/PULL ACTUATOR FOR MICROSTRUCTURES

(75) Inventors: Scott G. Adams, Ithaca, NY (US); Scott A. Miller, Ithaca, NY (US)

(73) Assignee: Kionix, Inc., Ithaca, NY (US)

( * ) Notice: Subject to any disclaimer, the term of this patent is extended or adjusted under 35 U.S.C. 154(b) by 286 days.

(21) Appl. No.: 10/322,941

(22) Filed: Dec. 18, 2002

(65) Prior Publication Data
US 2003/0132090 A1 Jul. 17, 2003

Related U.S. Application Data

(60) Provisional application No. 60/342,049, filed on Dec. 18, 2001.

(51) Int. Cl.
*H01F 7/08* (2006.01)
(52) U.S. Cl. .................. 335/220; 335/78; 200/181
(58) Field of Classification Search .............. 335/78, 335/128, 220; 200/181
See application file for complete search history.

(56) References Cited

U.S. PATENT DOCUMENTS

| | | | |
|---|---|---|---|
| 5,426,070 A | 6/1995 | Shaw et al. | |
| 5,554,304 A * | 9/1996 | Suzuki | 216/2 |
| 5,719,073 A | 2/1998 | Shaw et al. | |
| 5,846,849 A | 12/1998 | Shaw et al. | |
| 5,858,809 A * | 1/1999 | Chau et al. | 438/52 |
| 6,051,866 A | 4/2000 | Shaw et al. | |
| 6,239,473 B1 | 5/2001 | Adams et al. | |
| 6,366,186 B1 | 4/2002 | Hill et al. | |
| 6,377,143 B1 * | 4/2002 | Zhou et al. | 335/132 |
| 6,677,844 B1 * | 1/2004 | Gorospe et al. | 335/220 |
| 6,798,315 B1 * | 9/2004 | Schaefer | 333/105 |

OTHER PUBLICATIONS

Design of Low Actuation Voltage RF MEMS Switch, 0-7803-5687-X—2000 IEEE.

* cited by examiner

*Primary Examiner*—Elvin G. Enad
*Assistant Examiner*—Bernard Rojas
(74) *Attorney, Agent, or Firm*—Jones, Tullar & Cooper, P.C.

(57) ABSTRACT

A relay for switching an electrical signal includes switching elements, an actuator for closing the switch, and an actuator for opening the switch, the latter two of which are mechanically decoupled when the relay is in a mechanical rest position. When a relay close signal is applied, the closing actuator electrostatically drives the switching elements to complete a signal path between two terminals for the switched signal. In the process of closing the switch, the opening actuator remains stationary, i.e., no mass is displaced. Application of a switch open signal electrostatically drives the opening actuator, optionally in combination with a mechanical restoring force on the closing actuator, to open the switch to break the signal conduction path for the switched signal.

21 Claims, 7 Drawing Sheets

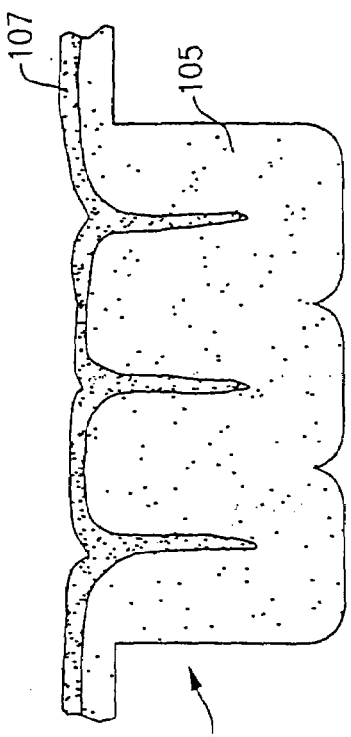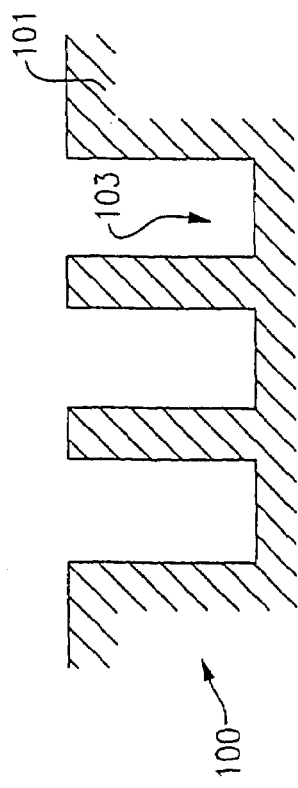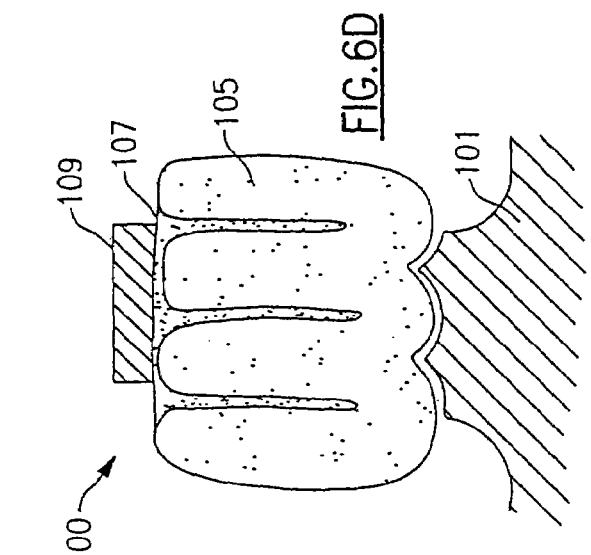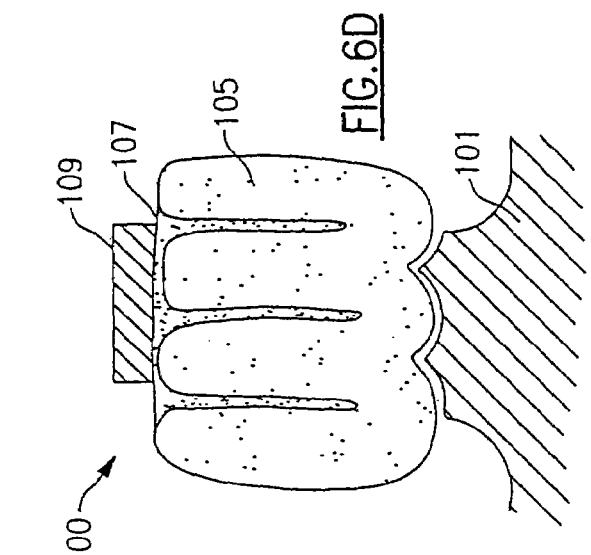

PUSH/PULL ACTUATOR FOR MICROSTRUCTURES

CROSS-REFERENCE TO RELATED APPLICATIONS

This application claims priority from U.S. Provisional Application Ser. No. 60/342,049 filed Dec. 18, 2001 and entitled METHODS FOR MICROSTRUCTURE MANUFACTURE AND APPARATUSES USING SAME, incorporated herein by reference.

FIELD OF THE INVENTION

This invention relates generally to the field of relay switches, and more particularly to a micro-switch used to switch an electrical signal such as an RF signal.

BACKGROUND OF THE INVENTION

MEMS switches have utility in a wide variety of applications, including instrumentation equipment, optical applications, wireless communications, and telephony. There are various MEMS switches known in the prior art, but they usually have only a closing actuator but not an opening actuator, so they can become stuck when the closing signal is terminated. Another problem is that the RF signal being switched provides an electrostatic force which sometimes causes the switch to close even when no control signal is applied. Still another problem is that electrostatic pull-in is typically used, which is unstable. A further problem is a switch remaining closed after the control signal has been terminated, due to surface effects on the switch contact surfaces.

SUMMARY OF THE INVENTION

Briefly stated, a relay for switching an electrical signal includes switching elements, an actuator for closing the switch, and an actuator for opening the switch, the latter two of which are mechanically decoupled when the relay is in a mechanical rest position. When a relay close signal is applied, the closing actuator electrostatically drives the switching elements to complete a signal path between two terminals for the switched signal. In the process of closing the switch, the opening actuator remains stationary, i.e., no mass is displaced. Application of a switch open signal electrostatically drives the opening actuator, optionally in combination with a mechanical restoring force on the closing actuator, to open the switch to break the signal conduction path for the switched signal.

According to an embodiment of the invention, a relay switch includes a switching element having a signal make condition and a signal break condition between at least first and second signal terminals; a closing actuator operatively responsive to a close signal applied to a close terminal whereby the closing actuator moves from a closing actuator rest position to a closing actuator driven position, wherein application of the close signal to the close terminal drives the switching element into the signal make condition; an opening actuator operatively responsive to an open signal applied to an open terminal whereby the opening actuator moves from an opening actuator rest position to an opening actuator driven position, wherein application of the open signal to the open terminal drives the switching element into the signal break condition; wherein the closing and opening actuators are mechanically decoupled when in their respective rest positions; and wherein the opening actuator remains in its rest position when the close signal is applied to the close terminal.

According to an embodiment of the invention, a relay switch includes a shorting bar; making means for making electrical connection between a signal-in terminal and a signal-out terminal; breaking means for breaking electrical connection between the signal-in terminal and the signal-out terminal; the making means including a first actuator which moves in a first direction to move the shorting bar into contact with the signal-in terminal and the signal-out terminal when a close signal is applied to the first actuator; and the breaking means including first spring means which moves the first actuator in a second direction when the close signal is terminated, thereby moving the shorting bar out of contact with the signal-in terminal and the signal-out terminal, the second direction being opposite to the first direction.

BRIEF DESCRIPTION OF THE DRAWINGS

FIG. 6A shows a cross-section of a step in constructing a silicon dioxide beam used in fabricating the relay switch of the present invention;

FIG. 6B shows a cross-section of a step in constructing a silicon dioxide beam used in fabricating the relay switch of the present invention;

FIG. 6C shows a cross-section of a step in constructing a silicon dioxide beam used in fabricating the relay switch of the present invention; and FIG. 6D shows a cross-section of a step in constructing a silicon dioxide beam used in fabricating the relay switch of the present invention.

DETAILED DESCRIPTION OF THE PREFERRED EMBODIMENT

Figure 1:
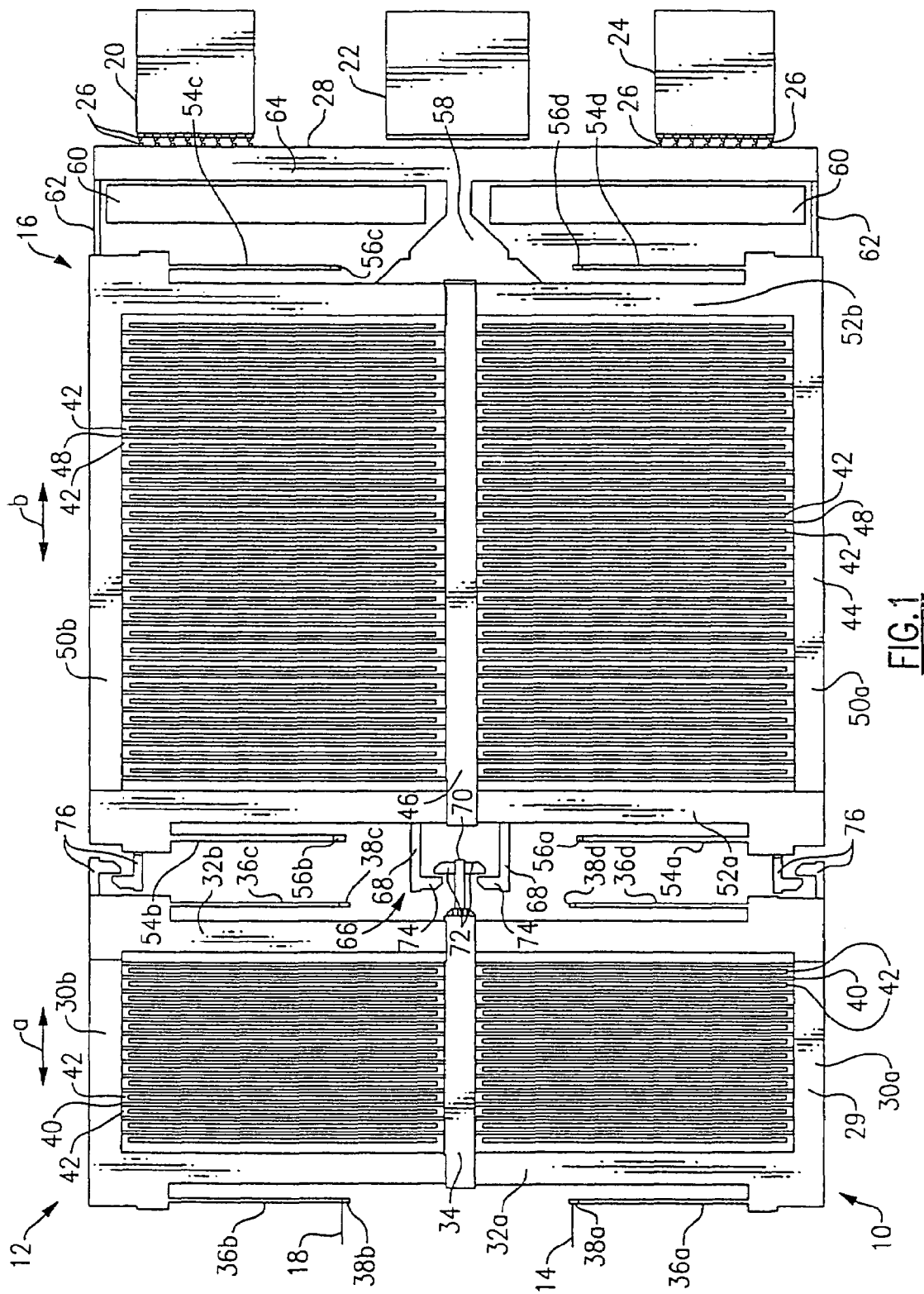
FIG. 1 shows a top view of a relay switch according to an embodiment of the invention.

Referring to FIG. 1, a relay switch 10 includes a pull actuator 12 with an open terminal 14 connected to a first end, a push actuator 16 with a close terminal 18 connected to a first end, and a signal-in terminal 20, a signal-ground terminal 22, and a signal-out terminal 24 connected to a second end of push actuator 16. All of these components are preferably etched out of a silicon wafer. FIG. 1 shows relay switch 10 in its mechanical rest position, when no signals are applied to either open terminal 14 or close terminal 18. The second end of push actuator 16 includes a plurality of switch contacts 26 and a conductor 28 or other signal transmission portion which shorts signal-in terminal 20 to signal-out terminal 24 when relay 10 is closed. When relay switch 10 is open, switch contacts 26 disengage from signal-in terminal 20 and signal-out terminal 24.

Pull actuator 12 is preferably formed as a generally rectangular frame 29, with sides 30a, 30b and sides 32a, 32b. A center backbone 34 extends from side 32a to side 32b. Frame 29 and center bar 34 are preferably formed from truss-structured silicon members. At the four corners of frame 29 are four flexure arms (springs) 36a, 36b, 36c, and 36d that allow motion of the pull actuator in the directions of arrow a. Arms 36a, 36b, 36c, and 36d are anchored to the substrate by anchors 38a, 38b, 38c, and 38d respectively. Anchors 38a, 38b, 38c, and 38d are preferably part of the silicon substrate.

Pull actuator 12 includes a number of capacitive/electrostatic plates 40 that extend from center backbone 34 to side 30b in one half of frame 29 and from center backbone 34 to side 30a in the other half of frame 29. These plates are preferably formed of truss-structured silicon beams. Because they are anchored at both ends against the larger frame members of pull actuator 12, a single truss-structured silicon beam is sufficient to provide the stiffness, i.e., resistance to bending, that they require.

Between each pair of capacitive/electrostatic plates 40 of pull actuator 12, a plurality of ground plates 42 extend vertically from the silicon substrate (not shown), which is grounded, in capacitive opposition to plates 40 of actuator 12. Ground plates 42 are formed from a portion of the original silicon wafer that is neither etched away nor released from the substrate. Plates 40 of pull actuator 12 and ground plates 42 together form a parallel plate actuator. The electrostatic force between plates 40 of pull actuator 12 and ground plates 42 provides the force that displaces pull actuator 12 to the left of arrow a. Displacement of pull actuator 12 to the right of arrow a occurs when the electrostatic force between plates 40 and plates 42 disappears and the spring force of flexure arms 36a, 36b, 36c, and 36d returns pull actuator 12 to its rest position as shown in FIG. 1.

Note that the spacing between each plate 40 of pull actuator 12 and the adjacent ground plate 42 to its left is considerably larger than between each plate 40 and the adjacent ground plate 42 to its right. This difference in capacitance gap, coupled with the $1/R^2$ falloff in field strength with distance from the two respective ground plates, provides a differential force that causes pull actuator 12 to pull to the left when open terminal 14 is energized.

In similar fashion to pull actuator 12, push actuator 16 preferably includes a generally rectangular outer frame 44 and a center backbone 46 preferably formed from truss-structured silicon members. A connecting truss 58 preferably provides support between center backbone 46 and a shorting bar 64. Frame 44 includes opposing sides 50a, 50b and opposing sides 52a, 52b.

Capacitive/electrostatic truss-structured silicon plates 48 extend from center backbone 44 to sides 50a and 50b. These plates are preferably formed of truss-structured silicon beams; because they are anchored at both ends against the larger frame members of push actuator 16, a single truss-structured silicon beam is sufficient to provide the stiffness, i.e., resistance to bending, that they require.

At the four corners of frame 44 are four flexure arms (springs) 54a, 54b, 54c, and 54d that allow motion of push actuator 16 in the directions of arrow b. Arms 54a, 54b, 54c, and 54d are anchored to the substrate by anchors 56a, 56b, 56c, and 56d respectively, which are preferably part of the silicon substrate. As with pull actuator 12, ground plates 42 extend up from the silicon substrate (not shown) to provide opposing electrostatic plates so that electrostatic forces may be developed that cause push actuator 16 to generate a force to the right as shown by arrow b in FIG. 1. Displacement of push actuator 16 to the left of arrow b occurs when the electrostatic force between plates 48 and plates 42 disappears and the spring force of flexure arms 54a, 54b, 54c, and 54d returns push actuator 16 to its rest position which is shown in FIG. 1.

The spacing between each plate 48 of push actuator 16 and the adjacent ground plate 42 to its right is considerably larger than between each plate 48 and the adjacent ground plate 42 to its left. This difference in capacitance gap, coupled with the $1/R^2$ falloff in field strength with distance from the two respective ground plates, provides a differential force that causes push actuator 16 to push to the right when close terminal 18 is energized with a close signal from about 0 to about 100 V depending on the particular embodiment design.

When relay switch 10 closes, push actuator 16 moves from its rest position to the right to close switch contacts 26 against signal-in terminal 20 and signal-out terminal 24. When opening switch 10, pull actuator 12 moves from the rest position to the left, dragging push actuator 16 with it. Thus, in normal operation, the range of motion of pull actuator 12 is from the rest position shown in FIG. 1 to a pull off position slightly to the left of the rest position. The range of motion for push actuator 16 is from the rest position shown in FIG. 1 to a closed position slightly to the right, sufficient to close the switch contacts. In some embodiments, push actuator 16 may in addition move slightly to the left of the rest position during the time pull actuator 12 is pulling off. Signal-in terminal 20, signal-out terminal 24, and signal-ground terminal 22 remain stationary. An electrical shield 60 is part of the grounded silicon substrate. Shield 60 is made of two silicon structures that project up from the silicon substrate, analogous to ground plates 42 interleaved with actuator plates 40, 48 to provide a ground isolation plane which electrically shields the drive part of push actuator 16 from the contact region.

The movement of pull actuator 12 and push actuator 16 are controlled at their respective four corners by flexure arms 36a–d for pull actuator 12 and flexure arms 54a–d for push actuator 16 as described above. One end of each flexure arm is anchored to the underlying silicon substrate by anchors 38a–d, 56a–d, while the other end is affixed to the respective corner of the respective actuator. The flexure arms operate in bending to allow pull actuator 12 and push actuator 16 to move through their respective ranges of motion and to restore the two actuators to their rest positions. The corner members are stiff enough to apply a restoring force to return actuators 12, 16 to the rest position when the open or close signal is removed, but compliant enough to allow the electrostatic forces developed between actuator plates 40, 48 and ground plates 42 to move actuators 12, 16 in the desired direction to make or break the contacts with the signal-in and signal-out terminals 20, 24.

In making and breaking contacts 26, it is desirable to minimize the amount of mass that has to be moved by the either push actuator 16 or pull actuator 12, so that the make or break occurs as quickly as possible. An interlocking "T" interface 66 centered near center backbone 34 of pull actuator 12 and center backbone 46 of push actuator 16 allows push actuator 16 to make contacts 26, while pull actuator 12 remains stationary and unconnected electrically. In the preferred embodiment, "T" interface 66 includes a center arm 70 extending from center backbone 34 of pull actuator 12. At one end of center arm 70, two side arms 72 extend perpendicular to the axis of center arm 70, thus forming the upper part of the "T". Two "L" arms 68 extend from side 52a of frame 44 of push actuator 16, positioned to either side of center backbone 46 of push actuator 16. "L"

portions 74 of "L" arms 68 extend towards each other and slightly overlap side arms 72. In an alternate embodiment, the "L" arms are replaced by "T" arms so that a plurality of "T" arms on side 32b of frame 29 of pull actuator 12 interlock with a plurality of "T" arms on side 52a of frame 44 of push actuator 16. The last arms on either side of the series of "T" arms are "L" arms.

The space between side arms 72 and "L" portions 74 is preferably slightly more than the travel distance of push actuator 16. Thus, at the time that contacts 26 are closed, the gap between side arms 72 and "L" portions 74 is nearly, but not entirely, closed. When it is time to break the contact between signal-in and signal-out terminals 20, 24, the close drive signal on push actuator 16 is turned off. Thus, the electrostatic force generated between ground plates 42 and capacitor/electrostatic plates 48 of push actuator 16 ceases, while the restoring force of the four corner flexure arms 54a–d urges push actuator 16 to its rest position, thereby carrying shorting bar 64 to the left to break contacts 26.

In addition to removing the close signal to push actuator 16, an open signal may be applied to pull actuator 12. When this is done, the electrostatic forces generated between plates 40 of pull actuator 12 and ground plates 42 tend to move pull actuator 12 to the left in FIG. 1. If any gap remains between side arms 72 and "L" portions 74, the first part of the motion of pull actuator 12 closes the gap between side arms 72 and "L" portions 74. Further motion of pull actuator 12 provides additional force to push actuator 16 to urge push actuator 16 leftward, back into its rest position, and to break contacts 26 at signal terminals 20, 24.

In the preferred embodiment, interlocking "L" arms 76 at the adjacent corners of frames 29 and 44 provide balance to the interaction between pull actuator 12 and push actuator 16.

The gaps in the mechanical coupling interface are preferably adjusted to optimize the performance of pull actuator 12. The gap is preferably large enough so that the coupling interface does not engage while push actuator 16 closes contacts 26. In this manner, none of the force of push actuator 16 is used to displace springs (flexure arms) 36a–d of pull actuator 12. However, once pull actuator 12 is energized and push actuator 16 is de-energized, pull actuator 12 should only move a short distance to engage the coupling interface, thus shortening the time for pull back and minimizing the amount of force that pull actuator 12 uses to displace flexure arms 36a–d.

Figure 2:
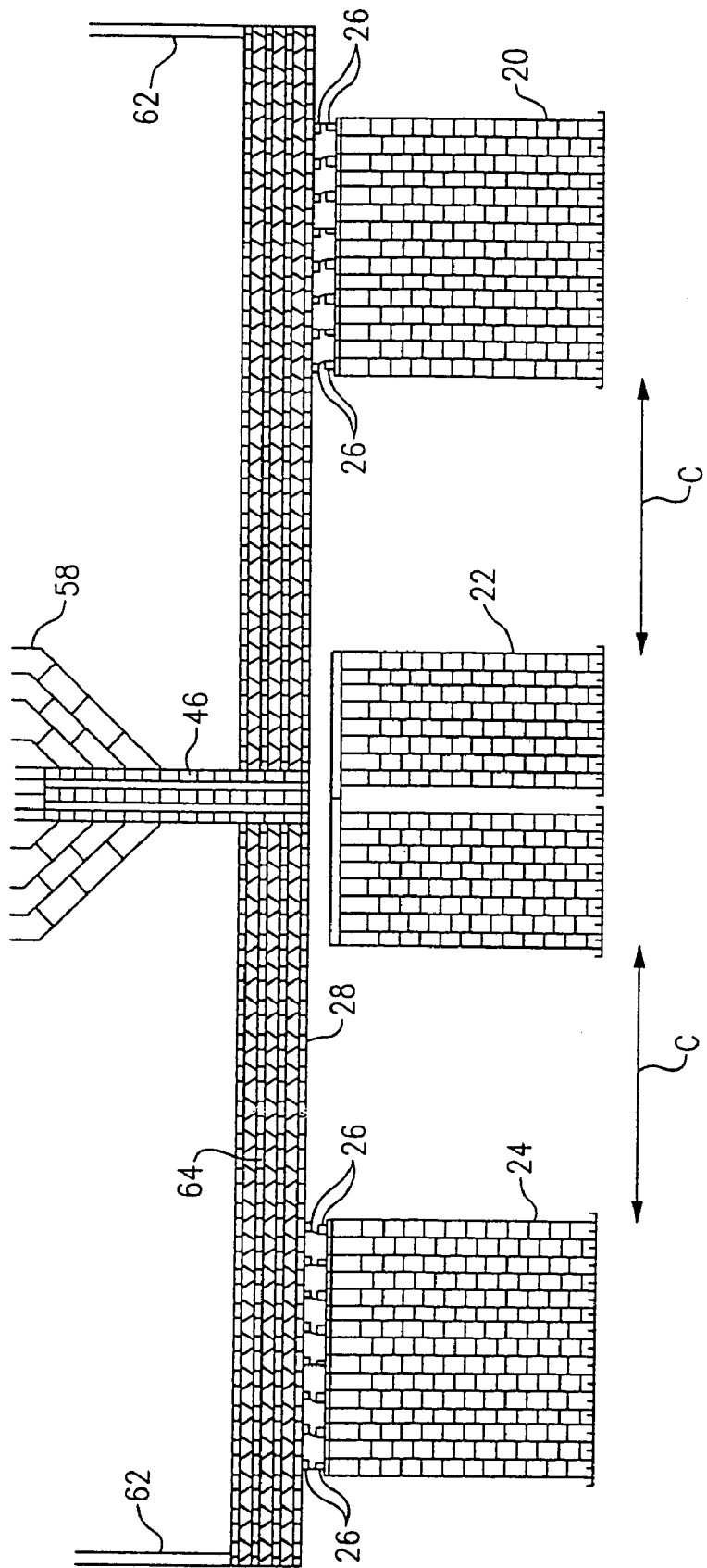
FIG. 2 shows details of the contact structure between a push actuator and the signal terminals of the relay switch of the present invention.

Referring to FIG. 2, details of the contact structure of push actuator 16 and signal-in terminal 20, signal-ground terminal 22, and signal-out terminal 24 are shown. Conductor 28 is preferably affixed to shorting bar 64. Shorting bar 64 is preferably made from silicon dioxide to provide significant isolation for the electrical contact between signal-in terminal 20 and signal-out terminal 24. Shorting bar 64 is connected to frame 44 by two arms 62. Arms 62 are each preferably made from a single silicon dioxide beam. Arms 62 provide stability for shorting bar 64 in the left-to-right dimension of FIG. 1. Because shorting bar 64 and frame 44 of push actuator 16 are potentially made of different materials that may have different coefficients of thermal expansion, the relatively thin arms 62 at the two ends of shorting bar 64 allow for differential expansion of shorting bar 64 relative to push actuator frame 44.

Silicon dioxide beams may be formed using an alternative method. Trenches in the pattern of the ultimately desired beam pattern may be etched into the silicon wafer, converted to silicon dioxide, and then etched using the same techniques that are used to etch and release the remainder of the device. This technique may also be used to form the beams of shorting bar 64 and connecting truss 58.

Conductor 28 is preferably a metal coating 84 (FIG. 4) on both the top side of shorting bar 64 and the side of shorting bar 64 with contacts 26 on it. In similar fashion, signal-in terminal 20 and signal-out terminal 24 have metal coatings on their top sides and on the sides with contacts 26 on them.

Signal-ground terminal 22 is disposed between signal-in terminal 20 and signal-out terminal 24. Signal-ground terminal 22 is a grounded region of metal that serves much the same purpose as a ground plane in a printed circuit board, i.e., to isolate any stray capacitances and/or inductances between signal-in terminal 20 and signal-out terminal 24. The signal lines are preferably kept a certain distance apart to prevent coupling and cross-talk. In an embodiment of this invention, this distance is 385 microns and is shown in FIG. 2 as distance c.

Figure 3:
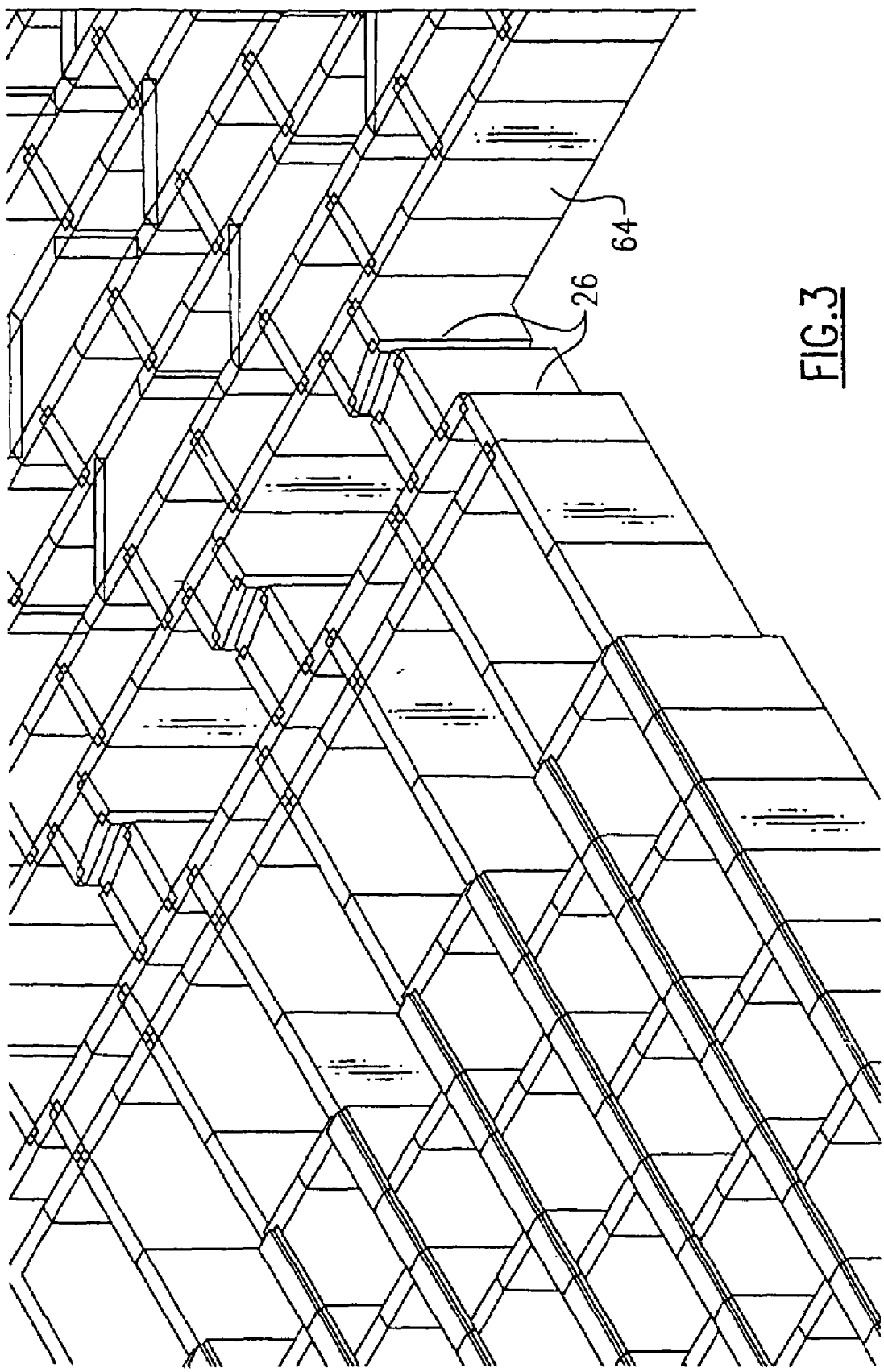
FIG. 3 shows details of the contact region between the shorting bar of the push actuator and the signal terminals of the relay switch of the present invention.

Referring to FIG. 3, the contact region between shorting bar 64 and either signal-in terminal 20 or signal-out terminal 24 is shown. Contacts 26 on shorting bar 64 and on signal terminals 20, 24 are projections that extend from shorting bar 64 and signal terminals 20, 24. Contacts 26 extend toward each other and preferably meet at a slightly angled pairs of faces. The angling of the faces allows small misalignments to be accommodated, and may provide some "scrubbing motion" as the contacts close to improve electrical contact.

Shorting bar 64 and signal terminals 20, 24 are preferably formed of silicon dioxide beams with metal on the top and sides. The silicon dioxide construction provides good electrical isolation between the RF signal being switched and the actuator control voltage. Having silicon in shorting bar 64 instead of silicon dioxide could permit a capacitive coupling of the RF signal into the close signal, which would be detrimental to the performance of the switch. However, because it is essential that contact resistances be very low in a relay or switch, metal is preferably deposited on the silicon dioxide beams either by vapor deposition or by sputtering to form a metal conductive layer. High conductivity metals such as gold are preferably used. After the RF signal passes through the first switch contact, through shorting bar 64, and through the second switch contact, it is routed through a set of hybrid beams and then back onto a planar surface. At this point is can be routed off of the chip through an output bond pad. In an alternate embodiment, portions of signal terminals 20, 24 are made of a composite beam having a silicon core with an oxidized silicon layer on the top and sides of the beam.

Figure 4A:
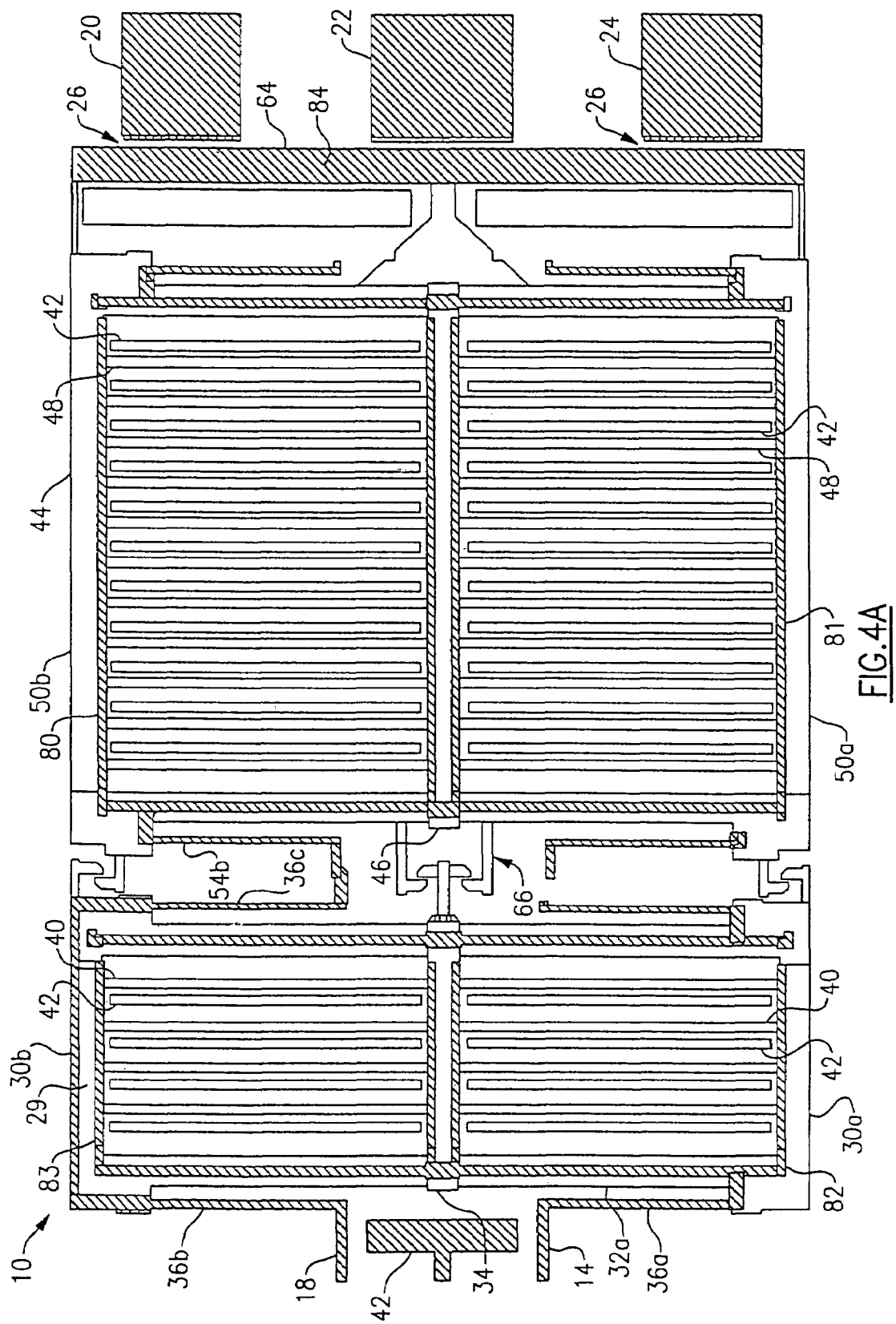
FIG. 4A shows metallized paths on the relay switch according to an embodiment of the present invention.
Figure 4B:
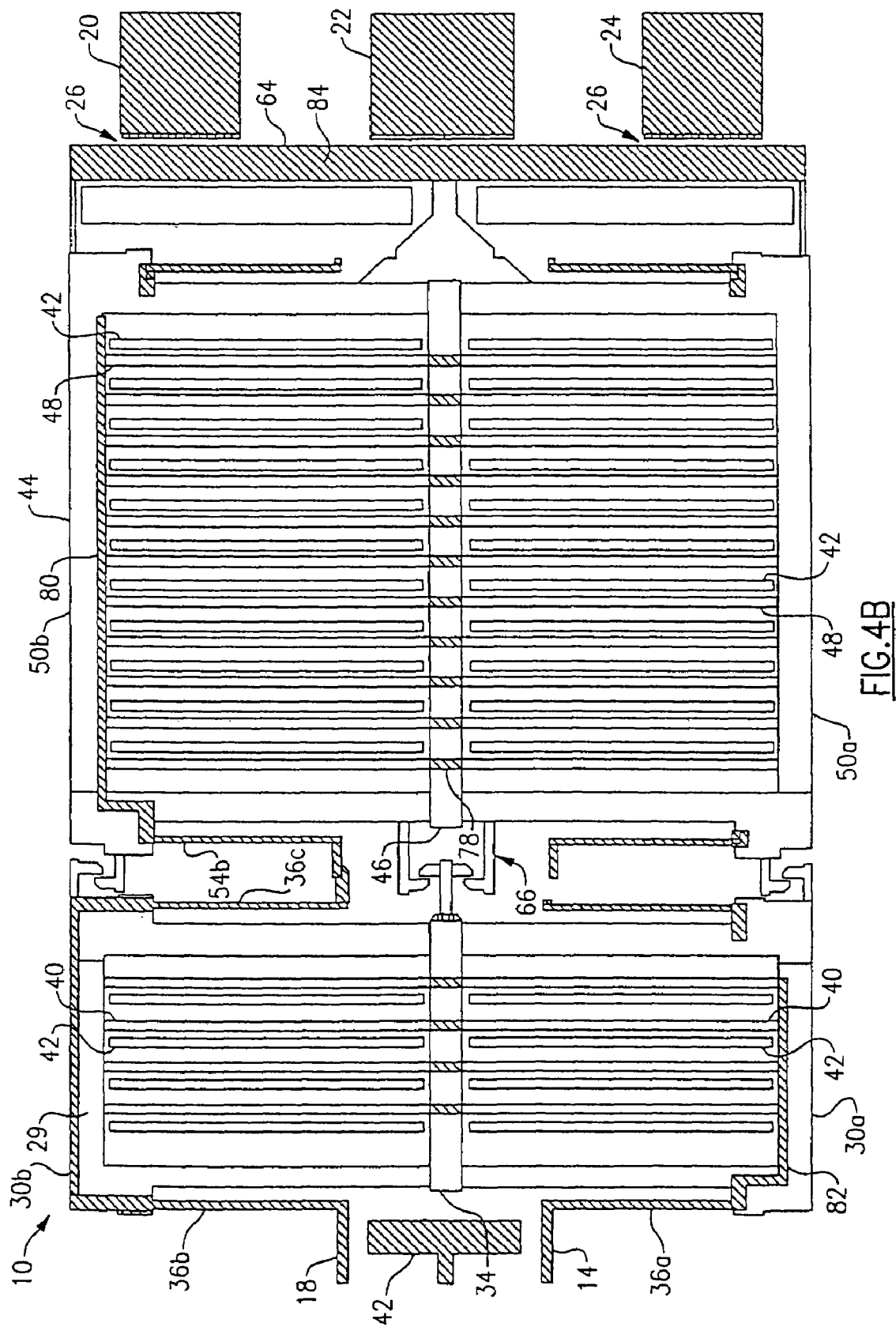
FIG. 4B shows metallized paths on the relay switch according to an embodiment of the present invention.

Referring to FIG. 4A, the metallized portions of push actuator 16 and pull actuator 12 are shown. The close signal comes in on close terminal 18 and for convenience is routed along the top of flexure arm 36b, the top of part of side 30b of frame 29, then along the top of flexure arm 36c and the top of flexure arm 54b. Metallic paths 80 and 81 continue along part of the top of sides 50b and 50a of frame 44 to provide voltage to plates 48. In like fashion, the open signal comes in on open terminal 14 and is routed along the top of flexure arm 36a and then portions of sides 30a and side 32a of frame 29. Metallic paths 82 and 83 continue along a portion of the top of sides 30a and 30b of frame 29 to provide voltage to plates 40. Optional metal paths 77, 79 on center backbones 34, 46, respectively, provide increased conductivity between plates 40 and likewise between plates 48. When the silicon being used is of low conductivity, optional metal paths 77, 79 become preferable. In FIG. 4B, another embodiment of wiring is shown in which plates 48 are electrically connected across center backbone 46 by jumpers 78, while plates 40 are electrically connected across center backbone 34 by jumpers 75. Note that metal paths are preferably laid down along the tops of all flexure arms so that the deformation characteristics are the same for all arms.

Figure 5:
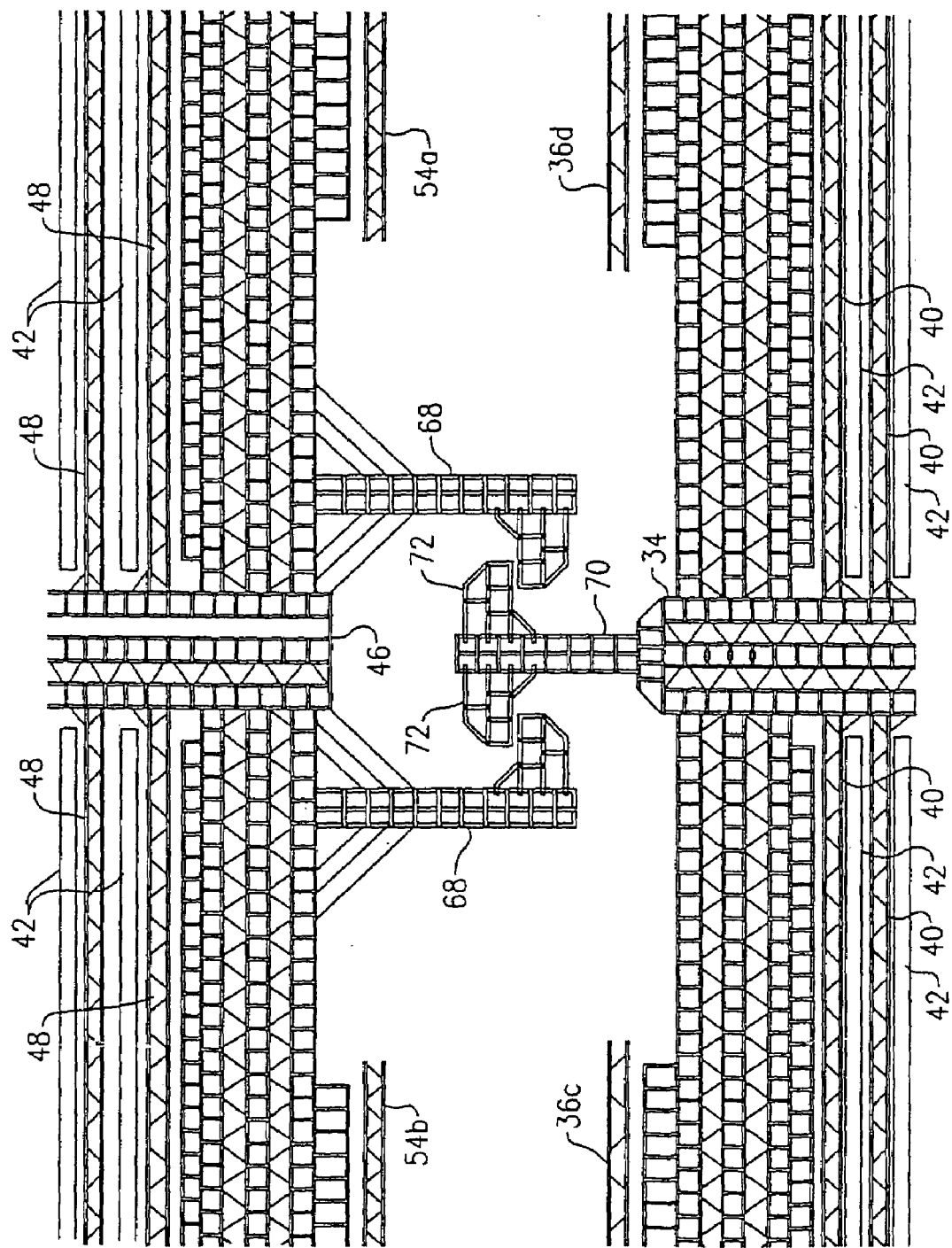
FIG. 5 shows details of the interlocking "T" of the relay switch of the present invention.

Referring to FIG. 5, a top view of pull actuator 12 and push actuator 16 shows the beam structure of the actuators. Push actuator 12 and pull actuator 16 are both preferably formed by etching the structure out of a silicon wafer. The wafer may have been selectively oxidized so that some portions of the actuators are formed of silicon dioxide. The processes for forming the actuators and isolation joints, and releasing them from the underlying silicon substrate, are discussed in U.S. Pat. No. 6,239,473 (Adams et al.) entitled TRENCH ISOLATION PROCESS FOR MICROELECTROMECHANICAL DEVICES; U.S. Pat. No. 5,719,073 (Shaw et al.) entitled MICROSTRUCTURES AND SINGLE-MASK, SINGLE CRYSTAL PROCESS FOR FABRICATION THEREOF; U.S. Pat. No. 5,846,849 (Shaw et al.) entitled MICROSTRUCTURE AND SINGLE MASK, SINGLE-CRYSTAL PROCESS FOR FABRICATION THEREOF; U.S. Pat. No. 6,051,866 (Shaw et al.) entitled MICROSTRUCTURES AND SINGLE MASK, SINGLE-CRYSTAL PROCESS FOR FABRICATION THEREOF; S. G. Adams, et. al., "Single-Crystal Silicon Gyroscope with Decoupled Drive and Sense", in *Micromachined Devices and Components V*, Patrick J. French, Eric Peeters, Editors, *Proceedings of SPIE* Vol. 3876, 74–83 (1999); K. A. Shaw, Z. L. Zhang, and N. C. Macdonald, "SCREAM I: A single mask, single-crystal silicon process for microelectromechanical structures", *Sensors and Actuators A*, vol. 40, pp. 63–70 (1994); and Z. L. Zhang, N. C. MacDonald, "A rie process for submicron, silicon electromechanical structures", *J. Micromech. Microeng.*, v2, pp. 31–38 (1992), all of which are incorporated herein by reference in their entirety.

Some portions of the original silicon wafer are preferably left in place to form mechanical and electrical portions of the relay structure. For example, the underlying silicon remains as a substrate to form the mechanical foundation for the entire structure, i.e., to hold all of the moveable components and terminals in place relative to each other.

Referring to FIGS. 6A–6D, a cross-section of a silicon dioxide beam 100 is shown in various stages of construction. Shorting bar 28 (FIG. 1) may be formed, in part or in whole, of such silicon dioxide beams. A region of silicon dioxide is preferably formed by first cutting a number of parallel trenches 103 in a silicon substrate 101, using techniques the same as or similar to those in U.S. Pat. No. 6,239,473 mentioned above. In FIG. 6B, silicon substrate 101 is exposed to oxidizing agents and temperatures so that the remaining silicon oxidizes to form silicon dioxide 105. As the silicon oxidizes, the volume increases by somewhere between a factor of two and a factor of three. Therefore, the widths of the initial trenches 103 are carved at a width relative to the remaining silicon projections, so that as those silicon projections oxidize, the trenches essentially fill themselves. To fill any residual trench between the faces of the oxide growth fronts, a layer of silicon dioxide 107 is preferably deposited, using such known techniques as plasma enhanced CVD (PECVD) or low temperature oxidation (LTO), on silicon dioxide 105 to fill in whatever trenches remain. As shown in FIG. 6C, metal is laid atop the silicon dioxide beam 100 so formed. As shown in FIG. 6D, silicon substrate 101 optionally remains to be used as a conductor, while metal 107 atop the silicon dioxide 105, 107 is used as a conductor for another signal. Because silicon dioxide is a good insulator and forms a relatively large separation between the silicon and the metal, this technique provides good electrical isolation between metal 107 and silicon substrate 101 for very high voltage stand-off capability, and reduces stray capacitances and stray inductances.

This technique is preferably used in relay 10 for forming large regions of silicon dioxide. For example, signal-in and signal-out terminals 20, 24 are preferably formed by laying a metal layer atop the thick layer of silicon dioxide, so that RF signals or any electrical signals in the metal layer of the terminals are isolated from the silicon substrate.

In an RF switch, high frequency signals must be well separated from ground and from each other to prevent loss and a high switch-off impedance, respectively. Starting with the entry of a high frequency signal to the input terminal, the signal must contact a bond pad to interface with the outside world. This bond pad and the wires leading to the relay mechanism are preferably constructed from metal on top of an oxide that in turn is on top of the silicon substrate. This metal-oxide-silicon structure forms a large capacitor that introduces losses to ground. The loss can be reduced by using a high resistivity substrate and/or dramatically increasing the thickness of the oxide. The high resistivity substrate works well in some applications and is common in the industry. Increasing the oxide thickness is not easy to do beyond a few microns. By using closely spaced oxidized trenches, with or without additional deposited oxide, a very thick oxide layer can be effectively produced to reduce the capacitance. An added benefit is that the breakdown strength is also increased dramatically, so that much higher voltages can be placed on this layer than in the case of a high resistivity substrate.

This reduced capacitance using the oxidized trenches has application in capacitive sensors. When this parasitic capacitance is reduced, so is one of the primary noise sources in capacitance based displacement sensors.

When the signal is on-chip, it can be routed as needed. When the signal path needs to go on top of released structures, a transition needs to be made. On flat surfaces, the metal is easy to pattern and align with other structures because the tolerances are large, e.g., greater than a few microns. On released structures the tolerances need to be submicron and therefore are dealt with in another fashion. Typically metal is patterned on release structures at the same time that the silicon structure is defined; this is referred to as a self-aligned process. The problem with using the typical process in the present invention is that the traditional method described in the referenced patents and publications has very little voltage stand-off protection along the sides of the oxide beams.

To avoid this problem, a blend of the traditional silicon beam fabrication method and the trench isolation process is used. By placing the oxide trenches in a location coincident with the sides of the silicon beam to be fabricated, a silicon beam structure with very thick sidewalls is obtained which has a very high voltage standoff capability. Furthermore, the metal can be patterned on top of this hybrid beam as a self-aligned part of the fabrication process. At this point, the metal can be routed on top of a hybrid silicon-thick-oxide-sidewall beam that is released from the substrate.

To form contact surfaces for an in-plane relay switch, metal must be deposited on the sides of a beam. One could try to do this using conventional techniques by attempting to blanket coat the wafer with metal and then pattern the metal on released structures. In all but a few special cases, this method is futile in that the released structures are destroyed. One aspect of the present invention is the use shadow-masking techniques to deposit metal only in the switch contact region. This coats the released structures and the silicon floor underneath the structures. Any metal or stack of metals that one chooses can be deposited without the need for further patterning.

The hybrid beams preferably run into the switch contact region to contact electrically the metal traces that run on top of the hybrid beams and the metal deposited using the shadow mask. The metal deposited through the shadow mask then contacts the metal traces on the hybrid beams and coats the contact surfaces for the relay switch.

The length of some of the trenches is preferably adjusted to prevent the sputtered contact metal from shorting. There are trenches in the contact region which run alongside the three signal lines 20, 22, 24. These trenches provide electrical isolation between the signal lines when the contact metal is deposited through the shadow mask. If the trenches aren't there to provide a physical barrier, the metal runs along the top surface of the wafer and shorts the signal lines. Unfortunately, the shadow mask deposition process does not provide a well-defined edge to the deposited metal pattern. The thickness of the deposited metal tapers off to zero beyond the edge of the shadow mask opening. How sharply it tapers off depends on the physical separation between the shadow mask and the wafer. Therefore, if the trenches do not extend far enough beyond the edge of the shadow mask opening, the electrical isolation is compromised by this "over spray" metal. Thus, the length of the trenches must be adjusted to prevent this shorting.

In alternate embodiments, the contacts are arranged so that they do not make physical contact, and thus do not pass current, when the contacts are closed, but instead have a very small gap. Alternatively, a thin dielectric film is deposited on the metal contacts to prevent electrical contact. Either configuration allows for the signal to be capacitively coupled to the contact bar, especially at higher frequencies. This arrangement may reduce losses through the switch.

In the switch contact, the opposing structures are typically made of the oxidized silicon beams. This permits excellent electrical separation between the actuators used to close the switch and the RF signals that run through the switch contact region.

While the present invention has been described with reference to a particular preferred embodiment and the accompanying drawings, it will be understood by those skilled in the art that the invention is not limited to the preferred embodiment and that various modifications and the like could be made thereto without departing from the scope of the invention as defined in the following claims.

What is claimed is:

1. A relay switch, comprising: a switching element having a signal make condition and a signal break condition between at least first and second signal terminals; a closing actuator operatively responsive to a close signal applied to a close terminal whereby said closing actuator moves from a closing actuator rest position to a closing actuator driven position, wherein application of said close signal to said close terminal drives said switching element into said signal make condition; an opening actuator operatively responsive to an open signal applied to an open terminal whereby said opening actuator moves from an opening actuator rest position to an opening actuator driven position, wherein application of said open signal to said open terminal drives said switching element into said signal break condition; wherein said closing and opening actuators are mechanically decoupled when in their respective rest positions; and wherein said opening actuator remains in its rest position when said close signal is applied to said close terminal.

2. A relay switch according to claim 1, further comprising: first means for providing a mechanical restoring force to said opening actuator which opposes movement from said opening actuator rest position; and second means for providing a mechanical restoring force to said closing actuator which opposes movement from said closing actuator rest position.

3. A relay switch according to claim 2, wherein said first means and said second means include a plurality of flexure arms attached to said opening actuator and said closed actuator, respectively.

4. A relay switch according to claim 1, wherein: said closing actuator includes a first plurality of electrostatic plates operatively associated with a first plurality of ground plates, wherein said closing actuator moves from said closing actuator rest position to said closing actuator driven position as a result of electrostatic force between said first plurality of electrostatic plates and said first plurality of ground plates; and said opening actuator includes a second plurality of electrostatic plates operatively associated with a second plurality of ground plates, wherein said opening actuator moves from said opening actuator rest position to said opening actuator driven position as a result of electrostatic force between said second plurality of electrostatic plates and said second plurality of ground plates.

5. A relay switch according to claim 4, further comprising an electrical shield between said at least first and second switching terminals and said first plurality of electrostatic plates of said closing actuator.

6. A relay switch according to claim 4, wherein said closing actuator includes: a rectangular closing frame consisting of first, second, third, and fourth closing frame elements; and a first center backbone connecting said first and third closing frame elements, wherein said first plurality of plates includes first and second groups of plates, and said first group of plates is connected between said second closing frame element and said first center backbone, and said second group of plates is connected between said first center backbone and said fourth closing frame element.

7. A relay switch according to claim 6, wherein said opening actuator includes: a rectangular opening frame consisting of first, second, third, and fourth opening frame elements; and a second center backbone connecting said first and third opening frame elements, wherein said second plurality of plates includes third and fourth groups of plates, and said third group of plates is connected between said second opening frame element and said second center backbone, and said fourth group of plates is connected between said second center backbone and said fourth opening frame element.

8. A relay switch according to claim 7, wherein said first and second center backbones are made of truss structured silicon beams.

9. A relay switch according to claim 7, wherein said rectangular opening frame and said rectangular closing frame are made of truss structured silicon beams.

10. A relay switch according to claim 7, further comprising means for mechanically coupling said opening actuator and said closing actuator when said opening actuator moves from said opening actuator rest position to said opening actuator driven position.

11. A relay switch according to claim 10, wherein said means for mechanically coupling includes an interlocking "T" interface.

12. A relay switch according to claim 13, wherein said interlocking "T" interface includes a "T" member affixed to either said first or second center backbones, and includes two "L" members, wherein said two "L" members are affixed to (a) said opening frame when said "T" member is affixed to said first center backbone, and to (b) said closing frame when said "T" member is affixed to said second center backbone.

13. A relay switch according to claim 12, further including two "L" interfaces at adjacent corners of said opening frame and said closing frame.

14. A relay switch according to claim 4, wherein said first and second pluralities of plates are formed of truss structured silicon beams.

15. A relay switch according to claim 1, wherein said switching element is made of a silicon dioxide beam having a conductive layer on at least one side.

16. A relay switch according to claim 1, further comprising means for mechanically coupling said opening actuator and said closing actuator when said opening actuator moves from said opening actuator rest position to said opening actuator driven position.

17. A relay switch according to claim 16, wherein said means for mechanically coupling includes an interlocking "T" interface.

18. A relay switch according to claim 17, wherein said interlocking "T" interface consists of silicon dioxide beams.

19. A relay switch, comprising: a shorting bar; making means for making electrical connection between a signal-in terminal and a signal-out terminal; breaking means for breaking electrical connection between said signal-in terminal and said signal-out terminal; said making means including a first actuator which moves in a first direction to move said shorting bar into contact with said signal-in terminal and said signal-out terminal when a close signal is applied to said first actuator; and said breaking means including first spring means which moves said first actuator in a second direction when said close signal is terminated, thereby moving said shorting bar out of contact with said signal-in terminal and said signal-out terminal, and a second actuator which moves said first actuator in said second direction when an open signal is applied to said second actuator, said second direction being opposite to said first direction.

20. A relay switch according to claim 19, wherein said breaking means includes second spring means which moves said second actuator in said first direction when said open signal is terminated.

21. A relay switch according to claim 19, further comprising first interface means on said first actuator and second interface means on said second actuator for mechanically interfacing said first actuator with said second actuator, wherein when said first and second actuators are at rest, said first and second interface means are mechanically decoupled from each other.

* * * * *